(12) United States Patent
Hamlin (10) Patent No.: US 7,127,692 B2
(45) Date of Patent: Oct. 24, 2006

(54) TIMING ABSTRACTION AND PARTITIONING STRATEGY

(75) Inventor: Christopher L. Hamlin, Los Gatos, CA (US)

(73) Assignee: LSI Logic Corporation, Milpitas, CA (US)

( * ) Notice: Subject to any disclaimer, the term of this patent is extended or adjusted under 35 U.S.C. 154(b) by 274 days.

(21) Appl. No.: 10/186,263

(22) Filed: Jun. 27, 2002

(65) Prior Publication Data

US 2004/0003362 A1    Jan. 1, 2004

(51) Int. Cl.
*G06F 17/50* (2006.01)

(52) U.S. Cl. ............... 716/6; 716/1; 716/2; 716/3; 716/4; 716/5; 716/18

(58) Field of Classification Search ............ 716/1–5, 716/6, 9, 10, 13, 16, 18; 714/72.5, 725; 713/503; 705/26; 703/15; 360/46; 326/82, 38
See application file for complete search history.

(56) References Cited

U.S. PATENT DOCUMENTS

| | | | |
|---|---|---|---|
| 5,907,698 A * | 5/1999 | Kucukcakar et al. .......... 716/6 |
| 6,145,117 A * | 11/2000 | Eng ............................. 716/18 |
| 6,360,356 B1 * | 3/2002 | Eng ............................. 716/18 |
| 6,470,482 B1 * | 10/2002 | Rostoker et al. ............. 716/6 |
| 6,523,151 B1 * | 2/2003 | Hekmatpour .................. 716/4 |
| 6,594,800 B1 * | 7/2003 | Chang et al. .................. 716/1 |
| 6,742,165 B1 * | 5/2004 | Lev et al. ..................... 716/1 |
| 2002/0188916 A1 * | 12/2002 | Ito ................................ 716/4 |

OTHER PUBLICATIONS

Hodges et al., Computer integrated manufactirung (semiconductor processing), Sep. 1989, Electronic manufactirung technology symposium, Proceedings, Seventh IEEE/CHMT International, pp. 1-3.*

* cited by examiner

*Primary Examiner*—Jack Chiang
*Assistant Examiner*—Helen Rossoshek
(74) *Attorney, Agent, or Firm*—Suiter, West, Swantz PC LLO (57) ABSTRACT

The present invention is directed to a timing abstraction and partitioning strategy for integrated circuit design. A method for designing an integrated circuit may include monitoring user interaction with logical blocks during a function design process of an integrated circuit. Indications of timing properties are derived during the functional design process.

2 Claims, 6 Drawing Sheets

TIMING ABSTRACTION AND PARTITIONING STRATEGY

CROSS REFERENCE TO RELATED APPLICATIONS

The present application hereby incorporates the following United Stated Patent Applications and Patents by reference in their entirety:

| Attorney Docket Number | Serial No. | Filing Date | Patent No. | Issue Date |
|---|---|---|---|---|
| LSI 01-390 | 10/015,194 | Nov. 20, 2001 | | |
| LSI 01-488 | 10/021,414 | Oct. 30, 2001 | 6,654,946 | Nov. 25, 2003 |
| LSI 01-489 | 10/021,619 | Oct. 30, 2001 | 6,792,584 | Sep. 14, 2004 |
| LSI 01-490 | 10/021,696 | Oct. 30, 2001 | 6,751,783 | Jun. 15, 2004 |
| LSI 01-524B | 10/044,781 | Jan. 10, 2002 | 6,640,333 | Oct. 28, 2003 |
| LSI 01-543 | 10/135,189 | Apr. 30, 2002 | | |
| LSI 00-695 | 09/842,335 | Apr. 25, 2001 | 6,795,849 | Sep. 21, 2004 |
| LSI 01-827 | 10/034,839 | Dec. 27, 2001 | | |
| LSI 01-828B | 10/061,660 | Feb. 1, 2002 | 6,779,168 | Aug. 17, 2004 |
| LSI 02-0166 | 10/135,869 | Apr. 30, 2002 | | |
| LSI 02-0560 | 10/185,740 | Jun. 27, 2002 | 6,769,168 | Jul. 27, 2004 |

FIELD OF THE INVENTION

The present invention generally relates to the field of integrated circuit design, and particularly, to a timing abstraction and partitioning strategy for integrated circuit design.

BACKGROUND OF THE INVENTION

Integrated circuit design and implementation is becoming more and more complex as the functionality and size of the circuits increase. A variety of users and manufacturers of devices utilizing integrated circuits desire an ever increasing array of functionality and performance in lower cost devices. To provide this desired array of products, producers of integrated circuit must become more efficient in the design and optimization of the circuits to ensure competitive positioning of their products.

One of the greatest hurdles in the design of an integrated circuit is the complexity encountered by the sheer numbers of components included on an integrated circuit, such as routing of the integrated circuit, timing between components of the integrated circuit, and other such "layout" considerations. To address this complexity, manufacturers of integrated circuits have to devote ever greater resources to these considerations. For example, timing closure of an integrated circuit was formerly addressed through sheer brute force, rather than through an ordered design process. Therefore, as the complexity continues to increase, the previous methods utilized to design integrated circuits will become even more insufficient for the task at hand. Such an inability to deal with complexity may lead toward a stagnation of products and a competitive disadvantage against other manufacturers that have addressed this complexity in an ordered and efficient manner.

Therefore, it would be desirable to provide a timing abstraction and partitioning strategy for integrated circuit design.

SUMMARY OF THE INVENTION

Accordingly, the present invention is directed to a timing abstraction and partitioning strategy for integrated circuit design. In an aspect of the present invention, a method for designing an integrated circuit includes monitoring user interaction with logical blocks during a function design process of an integrated circuit. Indications of timing properties are derived during the functional design process.

In an additional aspect of the present invention, a system for designing an integrated circuit includes a memory suitable for storing a program of instructions and a processor communicatively coupled to the memory, the processor is suitable for performing the program of instructions. The program of instructions configures the processor to monitor user interaction with logical blocks during a functional design process of an integrated circuit. Indications are derived of timing properties during the functional design process based on the monitored user interaction.

In a further aspect of the present invention, a system for designing an integrated circuit includes means for monitoring user interaction with logical blocks during a functional design process of an integrated circuit and means for deriving indications of timing properties during the functional design process based on the monitored user interaction. The deriving means is communicatively coupled to the monitoring means.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

Referring generally now to FIGS. 1 through 6, exemplary embodiments of the present invention are shown. The present invention addresses the development of a new architecture, initially directed at families of gate array products but is contemplated to encompass other products, in which the integration of a rapid development environment which customers' designers may use with a back end process which will rapidly produce manufacturable devices is exploited.

In order to do this most efficiently, the present invention proposes to factor the development environment formally between functionally oriented and timing oriented partitions. One motivation for this partitioning is to allow developers to use software simulation or hardware emulation iteratively in the functional development process without attempting to close timing at the same time. The technology employed for hardware emulation may possibly be very different from the technology of the device being designed, and would probably have very different timing characteristics. At the back end, the physical design process employs information about the design generated during the functional design completion phase to drive the back end stages rapidly toward timing closure and/or verification.

In order to formally partition the design and development flow in this way, timing specifications may be described and frozen at the outset, and appropriate constraints applied along the way so that the functional design development stays within permissible bounds required by the timing closure process.

One attractive way of approaching this is to use indicia, i.e. "hints", derived during the functional design phase, which may include background heuristics describing the likely timing properties of logical blocks within the hierarchy of functional elements.

These "hints" would not be explicitly incorporated in the functional design (which at this stage is directed at the simulation or emulation environments), but would be accumulated and passed on to the back end process as preliminary guidance regarding likely timing violations, tight margins, layout anomalies, jitter accumulation, and so on. The purpose of the hints may include identifying in a general way, and to encapsulate by functional block, the apparent timing dependencies implied by the functional design.

Figure 1:
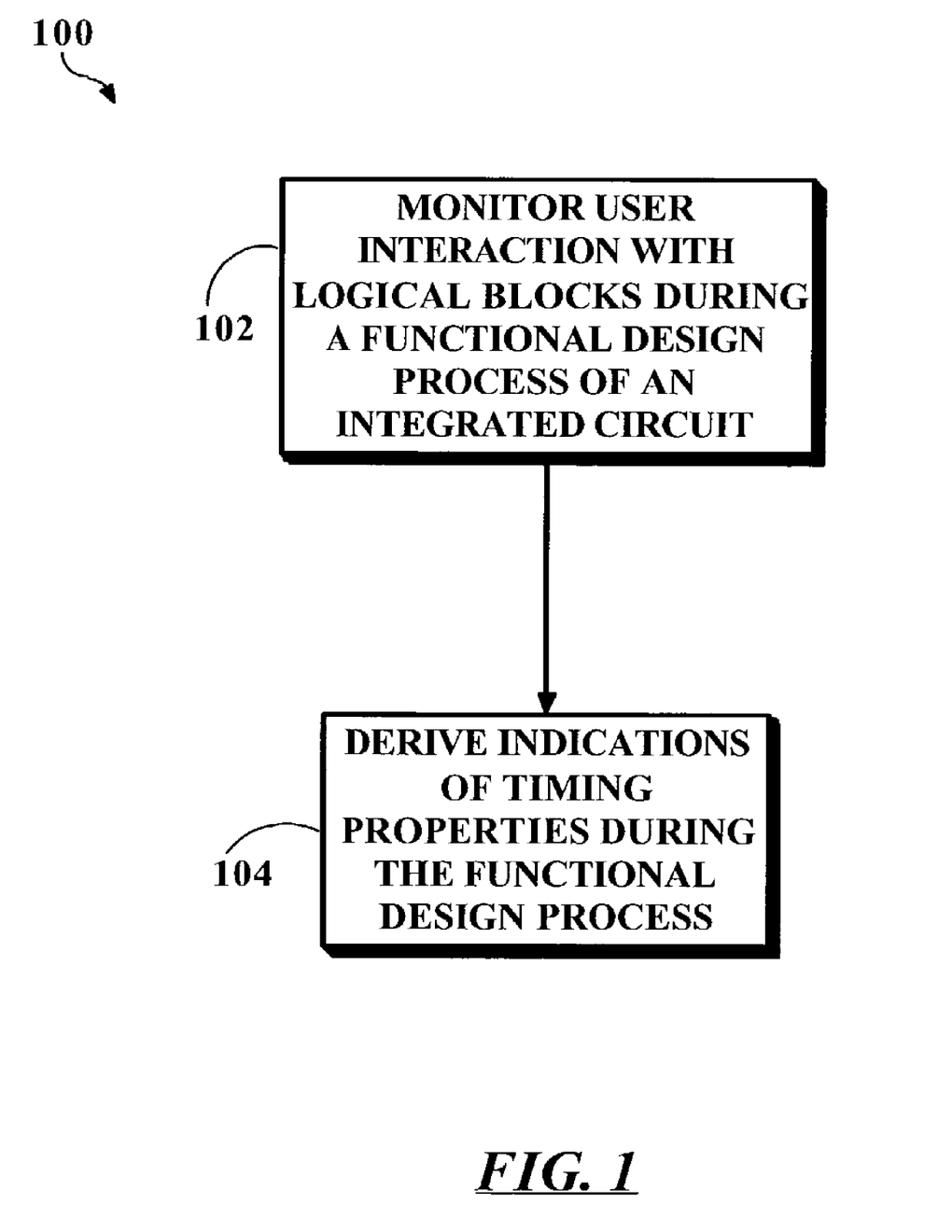
FIG. 1 is a flow diagram illustration of an exemplary method of the present invention wherein indicia of timing considerations are identified during a functional development process of an integrated circuit.

Referring now to FIG. 1, an exemplary method 100 of the present invention is shown wherein indicia of timing considerations are identified during a functional development process of an integrated circuit. User interaction with logical blocks is monitored during a functional design process of an integrated circuit 102. For example, a user may manipulate representations of functional blocks of an integrated circuit, and perform software simulation and hardware emulation separately without closing timing at the same time. Indications of timing properties are derived during the functional design process 104. These indications may be used during back end stages to rapidly complete timing closure and verification after completion of the functional design phase.

Figure 2:
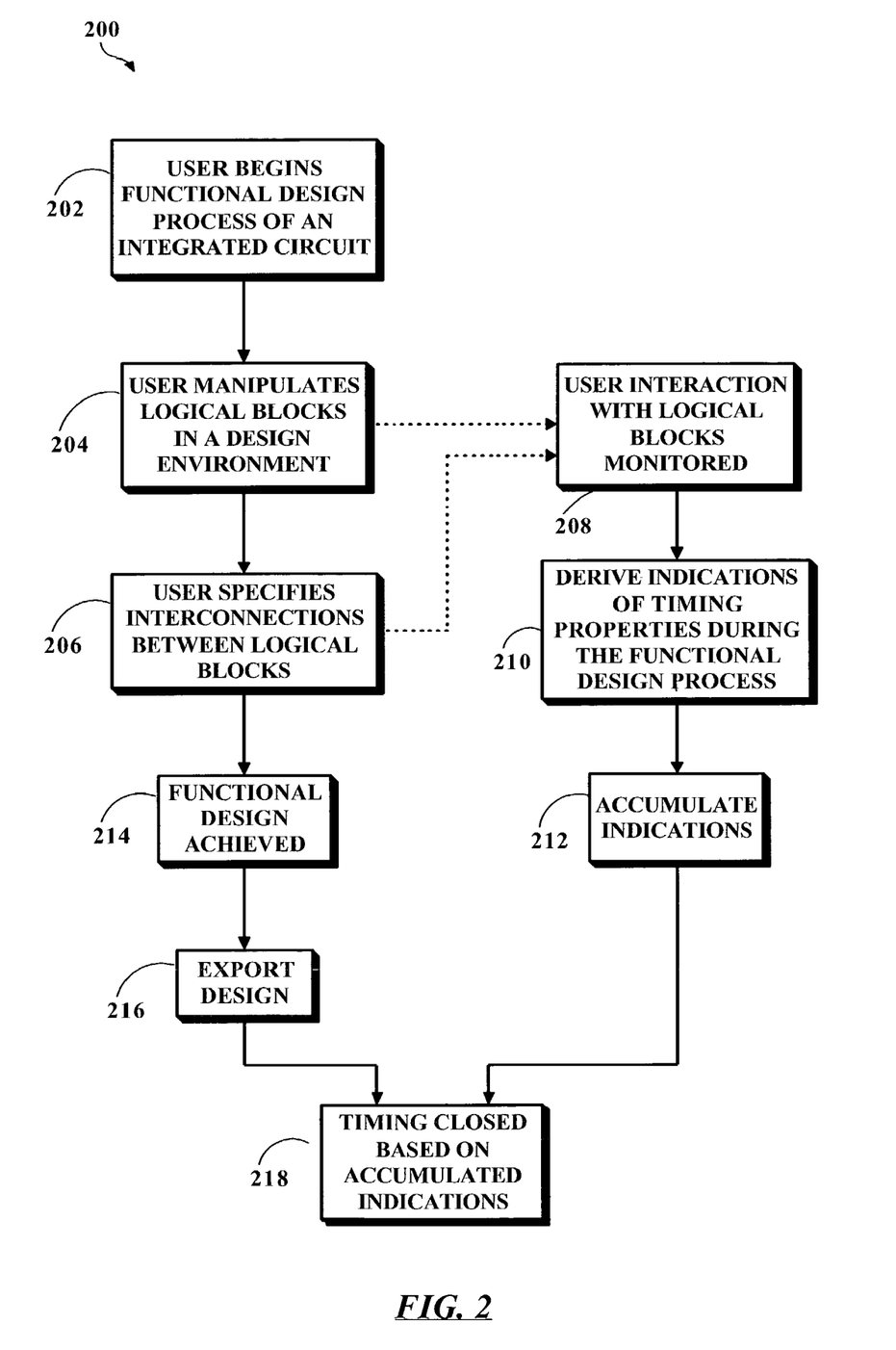
FIG. 2 is a flow diagram depicting an exemplary method of the present invention wherein user interaction with logical blocks and user-specified interconnects is utilized to derive indications of timing properties for later timing closure of the design.

Referring now to FIG. 2, an exemplary method 200 of the present invention is shown wherein user interaction with logical blocks and user-specified interconnects is utilized to derive indications of timing properties for later timing closure of the design. A user begins a functional design process of an integrated circuit 202. The user manipulates logical blocks in a design environment 204 and specifies interconnections between logical blocks 206. The user interaction with logical blocks is monitored 208, but in this instance, rather than directly affecting the functional design process, the indications of timing properties are derived 210 and accumulated 212. Therefore, the timing considerations may be initiated during the functional design process without affecting the functional design environment.

Once the functional design is achieved 214, such as the functional elements and interconnections specified, the design is exported 216. Additionally, the accumulated indications are also provided, so that timing may be closed based on the accumulated indications 218 in an efficient manner. In this way, the monitored interactions may be utilized to more efficiently close timing without interrupting the functional design process.

Figure 3:
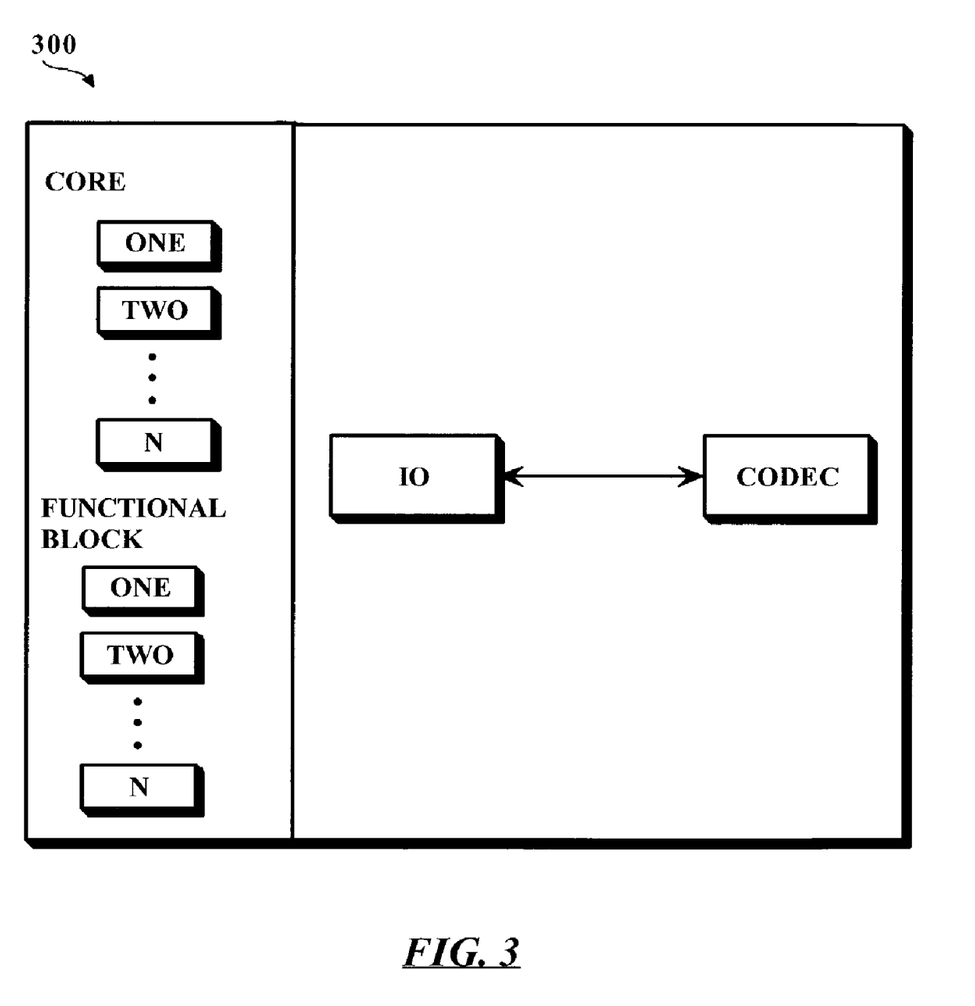
FIG. 3 is an illustration of an exemplary embodiment of the present invention wherein a design environment is shown.

A variety of functional design processes are contemplated by the present invention, such as the environment 300 shown in FIG. 3. In FIG. 3, a graphical user interface design environment is shown, in which a user may manipulate representations of logical blocks such as cores and functional blocks, and specify interconnections between representations. Through use of the present invention, such manipulation may be monitored and timing indications derived, such as by organization of representations, placement of representations, order of interconnections made, and the like, as contemplated by a person of ordinary skill in the art without departing from the spirit and scope of the present invention.

One important methodological step is to treat functional blocks as much as possible as independent modules from a timing point of view; the use of "hints" in the manner described would also contribute to the identification of reasonably isolable functional blocks whose modularity would contribute to ease of timing closure.

Figure 4:
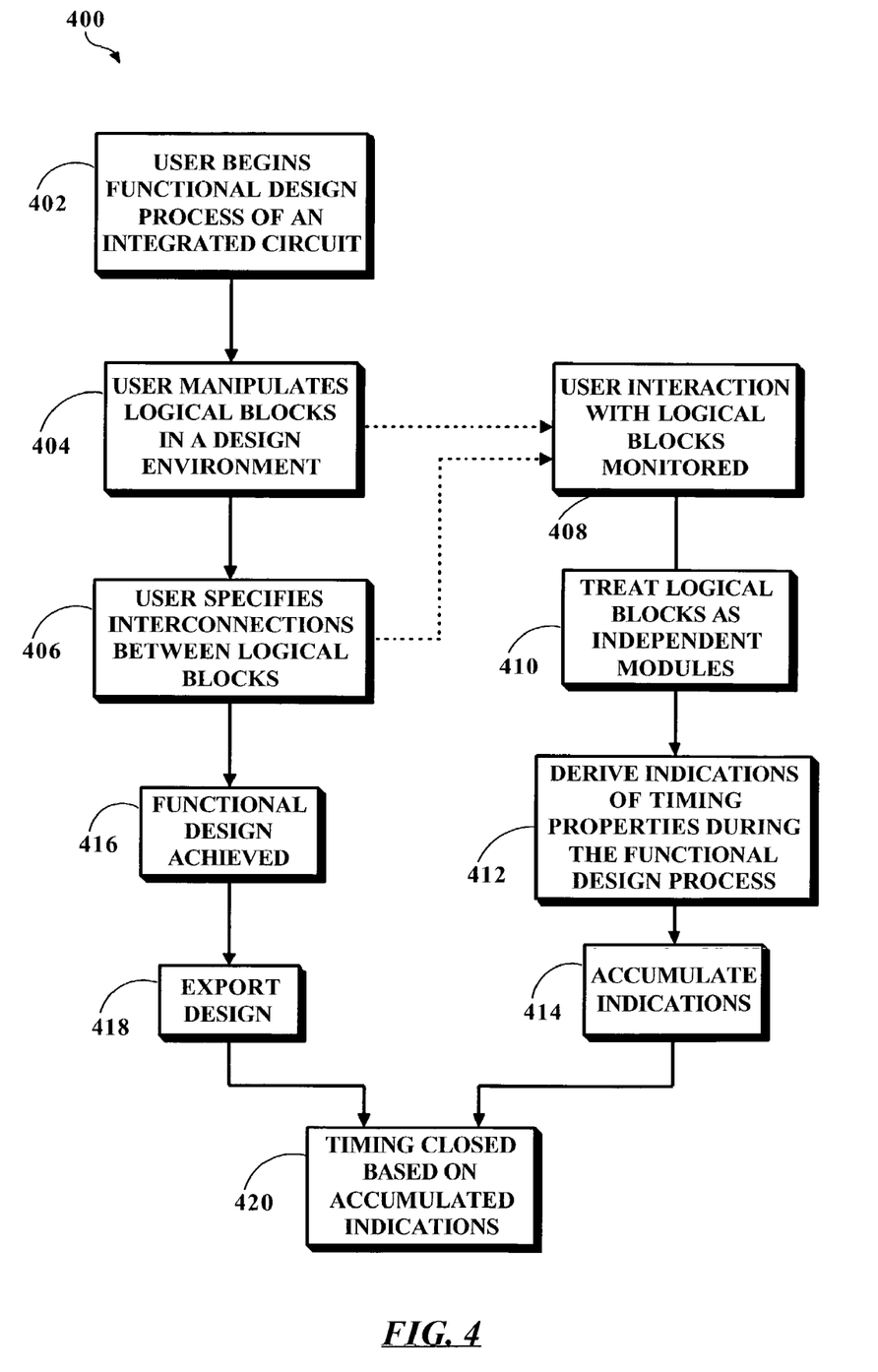
FIG. 4 is a flow diagram illustration of an exemplary method of the present invention wherein user interaction with logical blocks is monitored and logical blocks treated as independent modules for derivation of timing indications.

For example, referring now to FIG. 4, an exemplary method 400 of the present invention is shown wherein user interaction with logical blocks is monitored and logical blocks treated as independent modules for derivation of timing indications. A user begins a functional design process of an integrated circuit 402. The user manipulates logical block in a design environment 404 and specifies interconnections between logical blocks 406. The user interaction with logical blocks is monitored 408 and logical blocks treated as independent modules 410. This may prove advantageous in environments in which data corresponding to the logical blocks as maintained in a database, the data including characteristics of the logical blocks. Thus, "behind-the-scenes" functionality may be provided in the design environment to provide increased functionality yet offer the user of the environment an uninterrupted and efficient design situation. For instance, the indications of timing properties may be derived during the functional design process 412 based on data describing the functionality corresponding to user manipulated representations. The indications are accumulated for later use 414.

Once the functional design has been achieved 416, the design is exported 418 and timing closed based on the accumulated indications 420, as well as the relationship between the representations and indicated interconnections.

As an example, suppose a customer wishes to design a video processor for secure encrypted streams in a cable environment. The processor must encode and decode the compression/decompression process (say MPEG), and convolve the data with the encryption/decryption process. Suppose further that the intention is to use the device in high definition television applications, so it must synchronize at least 20 megabits/sec and generate decoded HDTV output. In addition to the codec and other hardware, the design includes one or more processors and a substantial number of RAM blocks.

Figure 5:
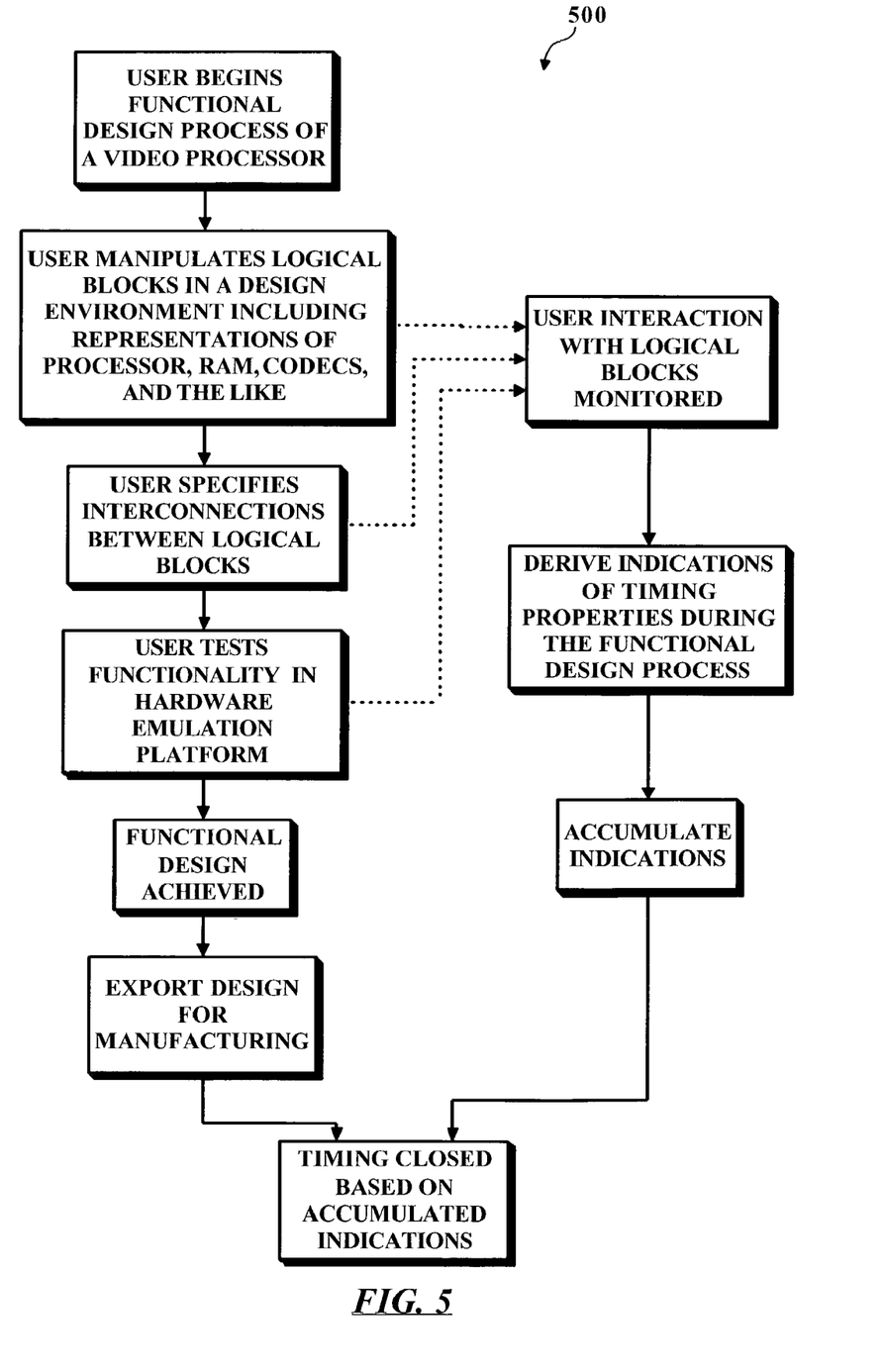
FIG. 5 is a flow diagram illustration of an exemplary method of the present invention wherein a designer chooses to test the functionality of the design on a hardware emulation platform while it is being created.

In the new development environment, the designer chooses to test the functionality of the design on a hardware emulation platform while it is being created, such as by utilizing the exemplary method 500 shown in FIG. 5. This means being able to run test streams through the encryption and decryption sections, to debug firmware for the embedded sections to assess their signal to noise ratio and freedom from artifacts. However in the emulation environment, it may not be possible to achieve actual high definition television output at the designed frame rate and resolution.

But as part of the present invention, critical timing is known for all major sections of the design, as well as for the inputs and outputs to the device. For instance, this information may be provided from a database having characteristic data of representations in a design environment. Therefore the development process may examine the timing implications of functional stages defined by the designers in RTL descriptions, and derive sets of "hints" from them, to be passed along when the design is handed off for physical production.

A mathematical formulation of the relationship may be provided between the functional description of the device, the block structure or hierarchy in which it is expressed, the timing implications of these blocks in terms of the timing specifications for the device, and the content and structure of the "hints" which are to be passed forward to the physical production tools for timing closure and verification. This temporal structure may anticipate static and dynamic timing analysis, and be constructed so that it adheres to the physical characteristics and margins of the target process and low level device architecture.

The fundamental basis for deriving these "hints" is a close examination (in the background of the front end development process) of how timing evolves in the simulated or emulated stages of functional development. Since in principle it should be possible to apply a speed scaling factor to any design element and to predict the timing margins associated with such scaling, the simulated or emulated (i.e. functional) version of the design may serve as a proxy for the design transposed to the actual target technology, whose 'micro' level timing behavior is very likely quite different. This in turn may be used to suggest both (a) areas of likely concern (bottlenecks, marginal circuits, etc.) and (b) paths to resolution of timing problems once the functional design has been expressed in the target technology.

Figure 6:
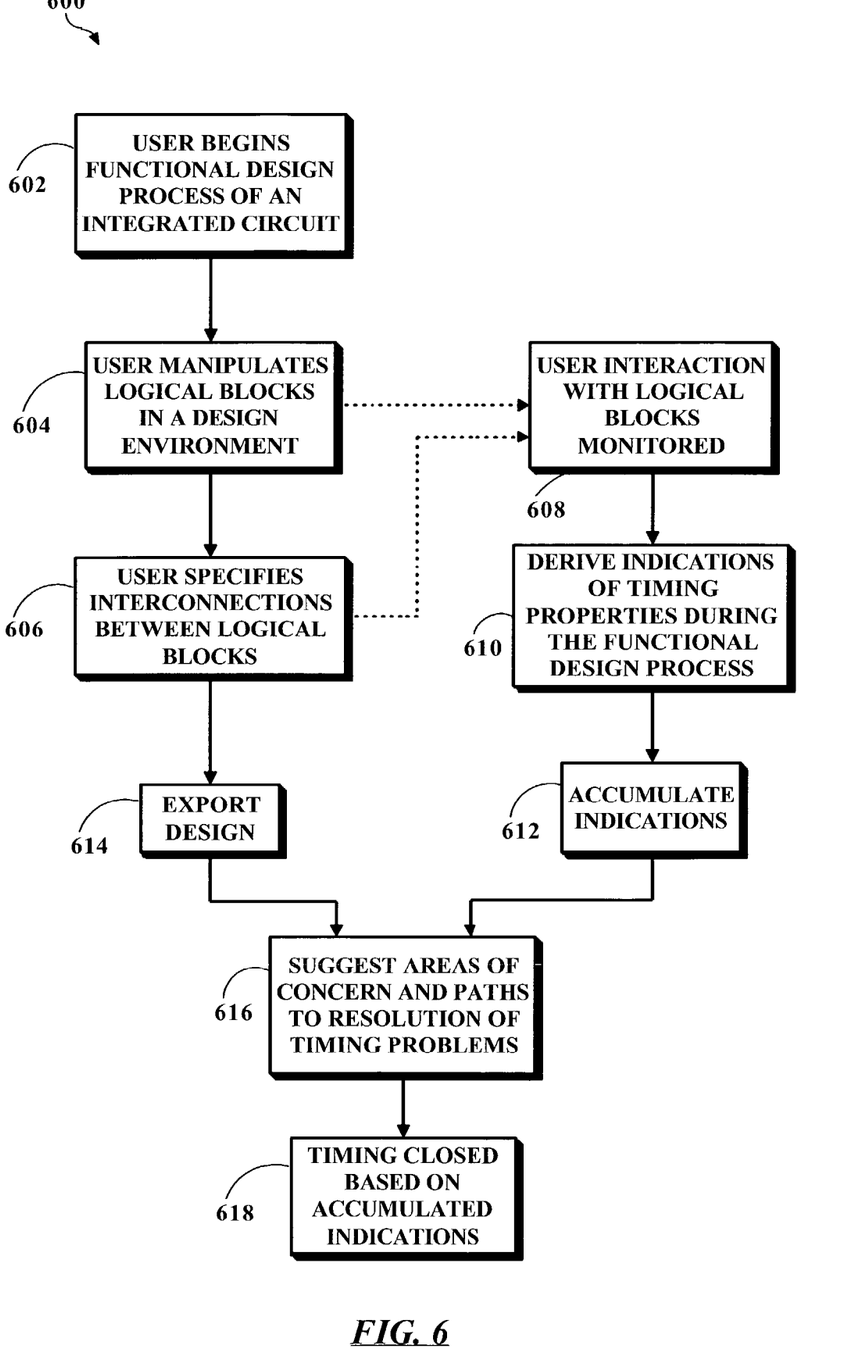
FIG. 6 is a flow diagram of an exemplary method of the present invention wherein areas of concern and paths to resolution of timing problems are provided based on functional design and derived indications of timing properties.

Referring now to FIG. 6, an exemplary method 600 of the present invention is shown wherein areas of concern and paths to resolution of timing problems are provided based on functional design and derived indications of timing properties. A user begins a functional design process of an integrated circuit 602, as before, manipulates logical blocks 604 and specifies interconnections between blocks 606. The user interaction with logical blocks is monitored 608 and indications of timing properties are derived 610, which are accumulated 612.

After the design is exported 614 (although this step may be performed before with departing from the present invention), areas of concern and paths of resolution of timing problems are suggested 616. For example, bottlenecks, marginal circuits, and the like, as contemplated by a person of ordinary skill in the art may be demonstrated. The timing is then closed based on accumulated indications 618.

Such a formulation applied to the previous example would guarantee that the timing would scale, from the completed functional emulation expressed at the RTL level, to the back end GDS-II and device production level. Thus if the emulation were conducted in accordance with the rules and tools of the present invention (such as based on this proposed timing partitioning) then the back end flow would be able to guarantee (for nearly all designs) that the designs would scale in timing when implemented in the target technology.

Referring again to the previous example of constructing a video processor previously discussed, in some instances, it might only be possible to make a hypothetical video processor output NTSC or PAL in emulation based on the utilized design environment, but the functionality of the video processor would be thoroughly tested and verified. When the back end processing was completed, timing could be verified fully for the intended high definition data rates through use of the present invention.

In exemplary embodiments, the methods disclosed may be implemented as sets of instructions or software readable by a device. Further, it is understood that the specific order or hierarchy of steps in the methods disclosed are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

Although the invention has been described with a certain degree of particularity, it should be recognized that elements thereof may be altered by persons skilled in the art without departing from the spirit and scope of the invention. One of the embodiments of the invention can be implemented as sets of instructions resident in the memory of one or more information handling systems, which may include memory for storing a program of instructions and a processor for performing the program of instruction, wherein the program of instructions configures the processor and information handling system. Until required by the information handling system, the set of instructions may be stored in another readable memory device, for example in a hard disk drive or in a removable medium such as an optical disc for utilization in a CD-ROM drive and/or digital video disc (DVD) drive, a compact disc such as a compact disc-rewriteable (CD-RW), compact disc-recordable and erasable; a floppy disk for utilization in a floppy disk drive; a floppy/optical disc for utilization in a floppy/optical drive; a memory card such as a memory stick, personal computer memory card for utilization in a personal computer card slot, and the like. Further, the set of instructions can be stored in the memory of an information handling system and transmitted over a local area network or a wide area network, such as the Internet, when desired by the user.

Additionally, the instructions may be transmitted over a network in the form of an applet that is interpreted or compiled after transmission to the computer system rather than prior to transmission. One skilled in the art would appreciate that the physical storage of the sets of instructions or applets physically changes the medium upon which it is stored electrically, magnetically, chemically, physically, optically or holographically so that the medium carries computer readable information.

It is believed that the system and method of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. A method of designing an integrated circuit, comprising:

monitoring user interaction with logical blocks during a functional design process of an integrated circuit; and deriving, without affecting the functional design process, indications of timing properties during the functional design process based on the monitored user interaction, the indications of timing properties including background heuristics describing timing properties of the logical blocks within a hierarchy of functional elements of the integrated circuit, wherein the indications of timing properties are used during back end stages to complete timing closure and verification after completion of the functional design process, and wherein a mathematical formulation is provided based on the achieved functional design and the derived timing indications, the mathematical formulation including functional description of the integrated circuit, block structure in which a relationship of logical blocks is expressed, hierarchy in which the logical blocks are expressed, timing implications of logical blocks in terms of timing specification for the integrated circuit, content of timing indications and structure of timing indications.

2. A system for designing an integrated circuit, comprising:

a memory suitable for storing a program of instructions; and a processor communicatively coupled to the memory, the processor suitable for performing the program of instructions, wherein the program of instructions configures the processor to monitor user interaction with logical blocks during a functional design process of an integrated circuit; and derive, without affecting the functional design process, indications of timing properties during the functional design process based on the monitored user interaction, the indications of timing properties including background heuristics describing timing properties of the logical blocks within a hierarchy of functional elements of the integrated circuit, wherein the indications of timing properties are used during back end states to complete timing closure and verification after completion of the functional design process, and wherein a mathematical formulation is provided based on the achieved functional design and the derived timing indications, the mathematical formulation including functional description of the integrated circuit block structure in which a relationship of logical blocks is expressed, hierarchy in which the logical blocks are expressed, timing implications of logical blocks in terms of timing specification for the integrated circuit, content of dining indications and structure of timing indications.

* * * * *